United States Patent [19]

Samarov et al.

[11] Patent Number: 5,184,281
[45] Date of Patent: Feb. 2, 1993

[54] HEAT DISSIPATION APPARATUS

[75] Inventors: Victor M. Samarov, Carlisle; Zeljko Arbanas, Lawrence, both of Mass.

[73] Assignee: Digital Equipment Corporation, Maynard, Mass.

[21] Appl. No.: 845,402

[22] Filed: Mar. 3, 1992

[51] Int. Cl.⁵ .............................. H05K 7/20
[52] U.S. Cl. ................... 361/386; 165/80.3; 165/185; 174/16.3; 361/383; 257/722
[58] Field of Search ............... 165/80.3, 185; 174/16.3; 357/79, 81; 361/381, 383, 386-389

[56] References Cited

U.S. PATENT DOCUMENTS

| | | |
|---|---|---|
| 3,366,171 | 1/1968 | Scharli ......................... 361/388 |
| 3,735,206 | 5/1973 | Pesek .......................... 361/386 |
| 4,591,896 | 5/1986 | Colton . |
| 4,624,303 | 11/1986 | Nippert . |
| 4,638,404 | 1/1987 | Grossmann et al. ............... 361/388 |
| 4,712,160 | 12/1987 | Hirakata et al. . |
| 4,764,845 | 8/1988 | Artus . |
| 4,867,235 | 9/1989 | Grapes et al. . |
| 4,909,752 | 3/1990 | Hallum et al. . |
| 4,971,570 | 11/1990 | Tollet et al. . |
| 4,975,825 | 12/1990 | Huss et al. . |
| 5,008,656 | 4/1991 | Cheriff et al. . |
| 5,109,318 | 4/1992 | Funari et al. .................. 361/386 |

Primary Examiner—Gregory D. Thompson
Attorney, Agent, or Firm—William P. Skladony; Ronald E. Myrick; Barry N. Young

[57] ABSTRACT

This invention relates to a heat dissipation apparatus for cooling a number of heat generating electrical components mounted on a printed circuit board, some of which components are arranged in pairs, each pair being separated by a space. The apparatus includes two heatsinks positioned such that the parallel, thermally conductive walls of the heatsinks are adjacent to the heat transfer surfaces of the components. Disposed within the space separating a given component pair is a pressing fastener which has a yoke with a V-shaped recess into which is positioned a wedge. The positioning of the wedge in the recess is adjusted by means of a screw, resulting in the tines of the yoke spreading as the wedge is drawn within the recess. As the tines spread, they engage the paired components pressing them in contact with the heatsink walls. Finally, as the screw is tightened, it compresses a Belleville spring which thereafter continues to apply a force on the screw, tending to urge the wedge within the recess and thereby keeping the components in pressed contact with the heatsink.

25 Claims, 3 Drawing Sheets

HEAT DISSIPATION APPARATUS

FIELD OF THE INVENTION

This invention relates to an apparatus for dissipating heat from electronic components, and more particularly relates to an apparatus which can be used to simultaneously cool a number of heat generating components in an electronic system.

BACKGROUND OF THE INVENTION

In many electronic systems various components, such as transistors, rectifiers, transformers and inductors, generate a substantial amount of heat during operation. In order to ensure that the components are not damaged during such operation, it is necessary that the heat generated by such devices be dissipated. Heat dissipation is typically done by means of a cooling apparatus, such as a heatsink.

There are a number of factors that must be considered in connection with the design of a heatsink apparatus. First, in order to maximize the thermal transfer between the components and the heatsink, it is desirable to have the heat transfer surface of a given component positioned in direct thermal contact with the heatsink. In some heatsink assemblies, the components are mounted on a thermally conductive base, which is then thermally coupled to the heatsink One disadvantage of this design is that the base, although thermally conductive, still offers some amount of thermal impedance, particularly at the base interface, making the overall cooling system less efficient. A consequence of the thermal inefficiency is that such systems may have to rely upon a larger heatsink to effect cooling, which has the disadvantage of taking up more space.

Secondly, the ease of assembling the components together with the heatsink, and the integration of that assembled unit with the rest of the system are an important concern. Since such assembly and integration are typically performed in a large scale manufacturing environment, it is desirable to have a non-labor-intensive design, involving a minimal number of easily combined parts.

Thirdly, the components that are to be cooled through the heatsink may have relatively wide dimensional tolerances. Such dimensional tolerances between the same types of components may not prove to be problematic when each component is mounted on its own heatsink. In those systems in which multiple components are cooled by the same heatsink, however, such dimensional variations may affect the successful coupling of the multiple heat transfer surfaces with a common heatsink.

Finally, in addition to the dimensional tolerances which result from the original manufacturing of the component, it is also common for the dimensions of a given component to change over time due to the creep of the material—such as plastic—out of which the component is constructed. This is also true with respect to components that are exposed to the expansion and contraction which results from thermal cycling. Accordingly, it is desirable to design a heatsink apparatus which accommodates dimensional variations between different components which are to be mated with a common heatsink, as well as the possible changes in dimension of a given component during its useful life.

SUMMARY OF THE INVENTION

The present invention relates to a heat dissipation apparatus which is capable of cooling a number of differently dimensioned, heat generating components, which are mounted on a base, such as a printed circuit board. In one embodiment of the invention, the apparatus includes two heatsinks positioned such that the thermally conductive walls of the heatsinks are opposed to and parallel with each other, and are thermally coupled with the heat transfer surfaces of the components. Such coupling can occur with the heat transfer surfaces in direct contact with the heatsink wall, or the heat transfer surfaces may be coupled through a thin, thermally conductive gasket, is similar to direct contact.

The apparatus further includes pressing fasteners, each of which is comprised of a yoke and wedge, which is positioned between pairs of components on the board. The fastener can be adjusted by means of a screw, which spreads the yoke apart by drawing the wedge within the yoke, so that contact surfaces of the yoke press the heat transfer surfaces of the components into thermal contact with the walls of the respective heatsinks. Although over time the dimensions of the components may have a tendency to change, due to material creep or thermal expansion/contraction, such dimensional changes are accommodated by a Belleville spring which deforms according to the changes and maintains a pressure on the screw tending to pull the wedge within the recess.

The spreading action of the yoke, and the resultant pressure on the heatsink walls tends to push the opposed heatsinks apart; however, the apparatus further includes a number of C-clamp brackets which keep the opposed heatsinks together. In addition, each heatsink is configured with a slot which accommodates the edges of the board so that the board is not released by the apparatus as the fasteners are tightened.

Objects of the invention are to provide a heat dissipation apparatus which is efficient, easy to use and assemble, and which can accommodate components having wide-tolerance dimensions, as well as dimensions which change over time due to material creep. Features of the invention are two opposed heatsinks which are pressed into thermal contact with the heat transfer surfaces of the components by means of the pressing fastener. One advantage of the invention is that it affords an easy to manufacture and assemble heat dissipation system. Another advantage is that due to the adjustable nature of the fastener, the invention will accommodate components with wide-tolerance dimensions, and will accommodate the creep of the component cases.

Other objects, features, and advantages of the invention will be further appreciated and better understood upon consideration of the following detailed description of the preferred embodiment, presented in conjunction with the accompanying drawings.

DETAILED DESCRIPTION OF THE PREFERRED EMBODIMENT

Figure 1:
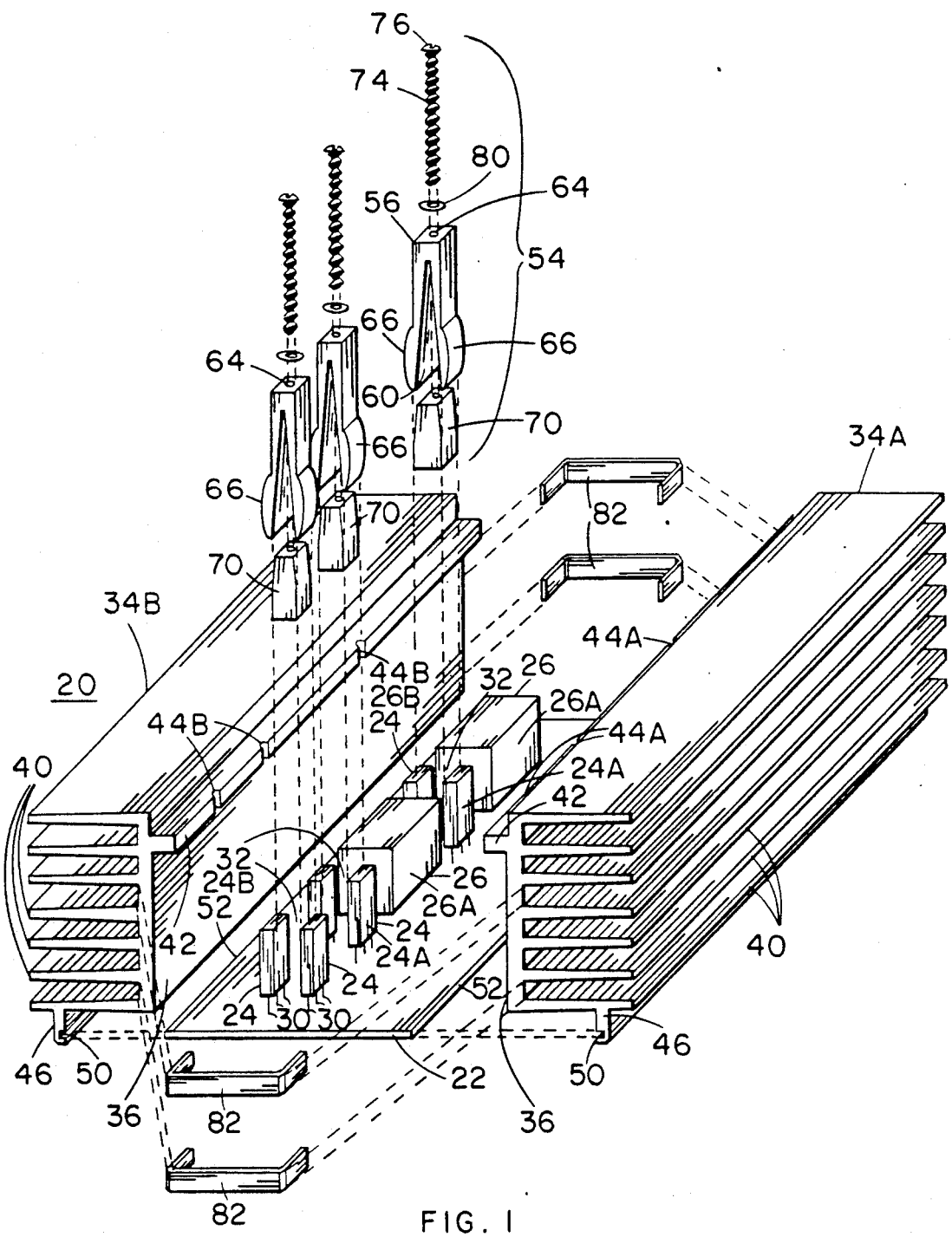
FIG. 1 is an exploded, isometric view of an embodiment of the invention, showing the heat dissipation apparatus along with a printed circuit board on which a number of components have been mounted.

Referring to FIG. 1, an isometric, exploded view of one embodiment of the heat dissipation apparatus of the present invention is shown and generally designated 20. In this illustration, an electronic system, such as a high power-density DC-to-DC converter for example, is comprised of a base, such as a printed circuit board 22, and a plurality of electronic components 24, 26, such as transistors, transformers, inductors, and rectifiers, which are mounted and electrically coupled to board 22 through leads 30. The exact type of components 24, 26 is not critical to the invention; however, components 24, 26 are electronic devices which generate heat during operation, and therefore need to be cooled.

In the particular embodiment shown in FIG. 1, some of the components 24 are relatively small, and are therefore arranged on board 22 with a like sized component so that the two components 24 form a component pair, with the paired components 24 being separated by space 32. In FIG. 1, there are three component pairs; however, th ®number of pairs can vary depending upon the configuration of the system to which an embodiment of the invention is applied.

Components 24 are said to be "like sized" because although they may in fact be the same component electrically, but supplied by different vendors, it is inevitable that there will be some variation in the physical size of the component cases simply due to the dimension tolerances which are designed into the manufacturing process by which components 24 are made. As will be detailed below, the apparatus of the present invention is designed to accommodate such size differences.

Each component 24 respectively has at least one, planar, heat-transfer surface, which is perpendicular to the plane defined by board 22. With respect to those components 26 that are too large to be arranged in a component pair, each such component 26 has at least one, and typically two, planar heat transfer surfaces. The paired components 24 which are separated by space 32 are positioned on board 22 such that the respective, heat transfer surfaces of each component 24 is in the same plane as the corresponding heat transfer surface of the larger component 26.

In other words, the size of components 24 selected for use on board 22 and the dimension of space 32 separating components 24 are factored together to ensure that all of the external, heat transfer surfaces of components 24, 26 generally define two, parallel planes, A and B. In addition, the planes formed by planar surfaces A and B are also parallel with and symmetric to an imaginary plane, which symmetrically divides board 22 and components 24, 26 by perpendicularly cutting the plane formed by board 22.

Figure 3:
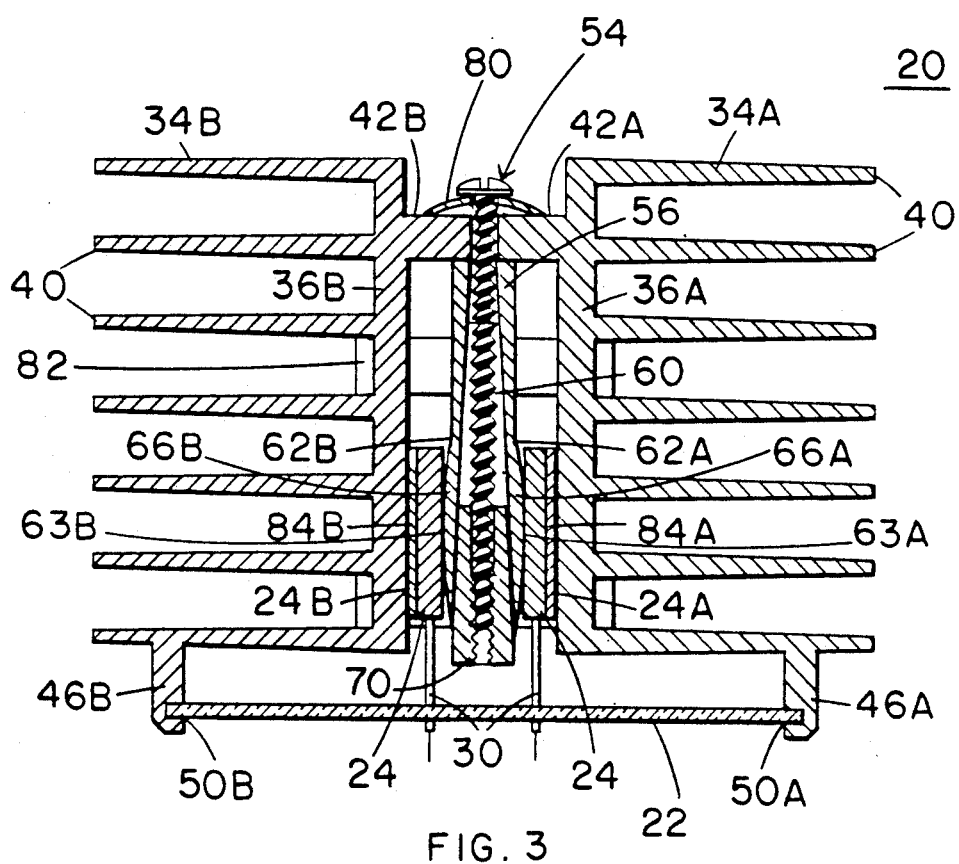
FIG. 3 is a side sectioned view of the embodiment of the invention shown in FIG. 2, the apparatus, board, and components having been sectioned by a plane running through the line 3—3 shown on FIG. 2.

Accordingly, the planar, heat transfer surfaces of components 24, 26 are labeled 24A, 26A, and 24B, 26B, respectively. In FIG. 1 multiple surfaces 24A are shown, while FIG. 3 shows a side view of surfaces 24A, 24B of one pair of components 24.

In one embodiment of the invention, the external heat transfer surfaces 24A, 26A, 24B, 26B of each component 24, 26 are actually covered with a very thin thermal gasket, having a low thermal impedance. A typical thermal gasket could be made of a thermally conductive material, such as that sold under the trademark Thermalsil by Thermalloy, Inc. Given that the thermal gasket is very thin, it has not been separately shown in FIGS. 1 or 2, but is rather treated as if it is one and the same with heat transfer surface 24A, 24B, 26A, 26B. The gaskets are, however, shown in FIG. 3 as reference numerals 84A, 84B.

In the embodiment shown in FIG. 1, apparatus 20 includes two, generally identical, and opposed, heatsinks 34A, 34B which are formed of extruded aluminum, for example. To the extent that heatsinks 34A, 34B are generally identical, they will be referred to by the common reference numeral 34. Likewise, the features which are common to each heatsink 34 will be represented by the same reference numeral. In those instances, however, where it is desirable to distinguish between the two heatsinks 34A, 34B, or their common features, the suffixes "A" or "B" will be used accordingly.

Referring still to FIG. 1, heatsink 34 is comprised of thermally conductive wall 36, which, when apparatus 20 is assembled, is generally perpendicular with the plane formed by board 22. Extending orthogonally outward from wall 36 are a plurality of heat transfer fins 40, each of which is generally parallel with the other fins 40 and also the plane formed by board 22. Extending orthogonally inward from wall 36 is ledge 42 which extends the length of wall 36.

Referring specifically to ledge 42B, it has three half screw holes 44B disposed therethrough. Heatsink 34A likewise has three half screw holes 44A disposed through ledge 42A, which are only partially visible in FIG. 1. When heatsink 34A is mated with heatsink 34B, the half holes 44A, 44B form a complete screw hole 44, with the axial centerline of screw hole 44 falling within the plane of symmetry of board 22.

Extending orthogonally downward from the lowest fin 40 on heatsink 34, as shown on FIG. 1, is board support 46, which extends the length of fin 40. Board support 46 has a slot 50 which extends its entire length, and the width of slot 50 is great enough to accommodate the thickness of the edges 52 of board 22.

Figure 2:
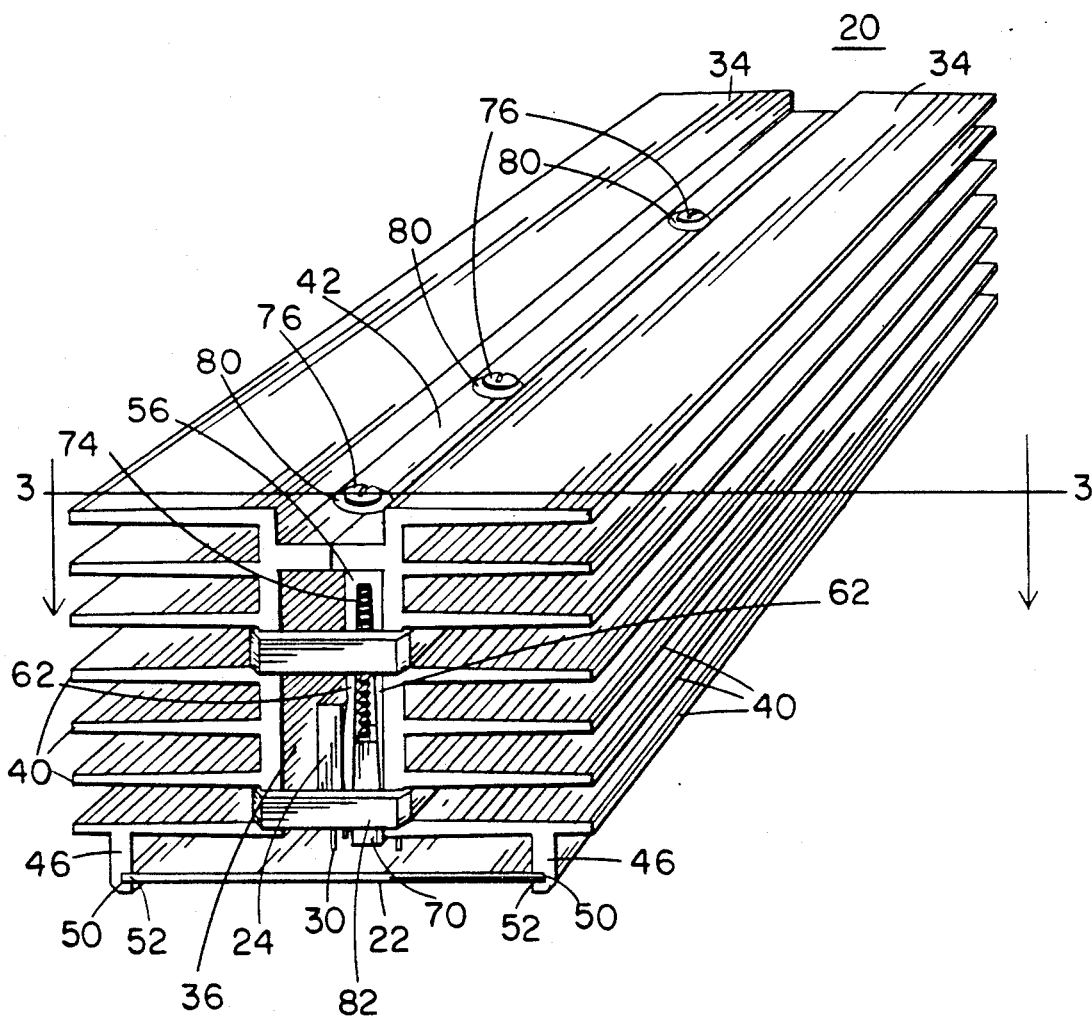
FIG. 2 is an isometric view of the embodiment of the invention shown in FIG. 1; however, the apparatus has been 10 assembled together with the board and components.

As shown in FIG. 1, apparatus 20 further includes three pressing fasteners, generally designated 54. Each such fastener 54 includes a V-shaped yoke 56, so called because the yoke has a central recess 60 in the shape of a "V", separating two, generally identical, flexible tines 62, as shown in FIG. 2. In addition, yoke 56 has a screw hole 64, which extends through the longitudinal centerline of yoke 56. In the particular embodiment shown, the external sides of tines 62 form contact surfaces 66A, 66B, which are convex shaped; however, in another embodiment of the invention those contact surfaces could be flat, instead of curved.

Fastener 54 includes a small angle (approximately 3–5 degrees) double sloped wedge 70, which is configured to be inserted into the V shaped recess 60 of yoke 56. Disposed through the longitudinal centerline of wedge 70 is threaded screw hole 72. Fastener 54 also includes screw 74, which is dimensioned so that it can extend through screw hole 44 in ledge 42, screw hole 64 in yoke 56, and matingly engage the threads of screw hole 72 of wedge 70. Interposed between the bottom of screw head 76 of screw 74 and the top of yoke 56 is Belleville spring 80. Although only one Belleville spring 80 is shown in FIGS. 1–3, in other embodiments of the invention it is possible to have multiple Belleville springs 80 on the same screw 74.

Apparatus 20 also includes a plurality of C-shaped brackets 82, which are designed so that they can clamp around the external sides of walls 36A, 36B, as indicated by the dashed lines in FIG. 1, and shown more clearly in FIG. 2.

Referring now to FIGS. 2 and 3, the embodiment of the invention shown in FIG. 1 in exploded view has been combined to form a unitary, heat dissipation apparatus 20. More particularly, the sub-elements forming apparatus 20, discussed in connection with FIG. 1, have been assembled together to form the illustration shown in FIG. 2. FIG. 3, on the other hand, is a side sectioned view of the apparatus 20, board 22 and components 24, shown in FIG. 2, sectioned by a plane which runs through line 3—3 in FIG. 2. When apparatus 20 is assembled, as shown in FIG. 2 and 3, it forms a unit which is generally symmetric around the plane of symmetry of board 22.

Although the following explanation of the assembly of apparatus 20 relates to one fastener 54 and one pair of components 24, given that the other two fasteners 54 and pairs of components 24 shown in FIG. 1 are identical, the explanation applies equally to them.

Firstly, wedge 70 is inserted in yoke 56 so that the inclined slope of wedge 70 is matingly inserted within the V-shape of recess 60. Screw 74 is fitted with Belleville spring 80 and inserted through screw hole 64 in yoke 56 and partially, but not completely, screwed into threaded screw hole 72 in wedge 70. Fastener 54 is then inserted in space 32 between components 24 such that convex shaped contact surfaces 66 of tines 62 will engage the two, inwardly facing regions 63A, 63B of components 24A, 24B as shown in FIG. 3.

Next, heatsinks 34A, 34B are moved inwardly so that ledges 42A, 42B meet at the plane of symmetry which divides board 22 and components 24, 26. With heatsink 34 so joined, screw 74 extends through screw hole 44 so that screw head 76 and Belleville spring 80 are positioned above the joined ledges 42A, 42B. With screw 74 so positioned, it will lock heatsinks 34A, 34B so that they are restricted from longitudinal movement relative to each other. Furthermore, as heatsinks 34A, 34B are moved inward, they are aligned with board 22 such that edges 52 are inserted into slots 50. Accordingly, edges 52 of board 22 are snugly grasped by the slots in board supports 46.

Finally, brackets 82 are clamped around the external edges of walls 36, at the two opposing ends of heatsink 34, as shown in FIG. 1 and partially shown in FIG. 2.

Referring specifically to FIG. 3, through the side sectional view, it can now be seen that the heat transfer surfaces of components 24 are optionally covered with a thermal gasket 84, the dimensions of which are exaggerated in FIG. 3 for illustration purposes. Although, technically speaking, gasket 84 is interposed between component 24 and wall 36, for practical purposes, component 24 and heatsink 34 are in direct thermal contact. Accordingly, for purposes of this document the term "direct" thermal contact is intended to mean that the heat generating component is either touching the heatsink wall or separated by only a thermal gasket. Thus, the application of the term "direct", in this instance, is intended to be distinguished from heatsink assemblies in which the component is mounted on a board or base, and that board or base is then coupled to the heatsink. Such arrangements would not be covered by the term "direct", as used herein.

By viewing FIGS. 1 and 3, it can be seen that the dimensions of components 24, 26, and space 32 are factors in the successful design of the heat dissipation system. In FIG. 1 it is clear that a number of components 24, 26 are spaced and linearly arranged along the plane of symmetry of board 22. This linear arrangement is to position components 24, 26 so that the external, heat transfer surfaces of all of the components 24, 26 together define the two planes A and B. If, due to manufacturing tolerances, the dimensions of the packaging of components 24 are not identical, which is almost guaranteed in a manufacturing environment, the dimensional differences may result in a lack of coplanarity amongst the heat transfer surfaces of the different components 24, 26, which define either plane A or plane B.

Moreover, the dimensions of heatsink 34 are also important. Specifically, walls 36 must be high enough to accommodate components 24, 26. Also, ledges 42 must be dimensioned such that when heatsinks 34A, 34B are mated and attached with board 22, as described above, the inner surface of wall 36A must be adjacent to the component heat transfer surfaces 24A, 26A which define plane A, while the inner surface of wall 36B must be adjacent to the component heat transfer surfaces 24A, 24B, which are shown on FIG. 1 and which define plane B.

Understanding the problem of differing component dimensions and the need for thermal coupling between th®heat transfer surfaces and the wall 36, one of the key advantages of the invention can be appreciated. Referring to FIG. 3, after heatsink 34A, 34B are combined, and with tines 62 of fastener 54 appropriately positioned in space 32 between components 24, screw 74 will be tightened. As screw 74 is tightened, wedge 70 will be drawn within recess 60 and have a tendency to spread apart the flexible tines 62 of yoke 56. As tines 62 spread apart, their convex contact surfaces 66 will be pressed in tighter contact with the inwardly facing regions 63A, 63B of components 24, having a tendency to push paired components 24 apart. As they are pushed apart, heat transfer surfaces 24A, 24B, which are covered by gasket 84, are pressed in direct contact with the inner surface of walls 36A, 36B, respectively. A resulting benefit of this pressed contact is that because components 24 are so tightly coupled with heatsink 34, the thermal conduction between the heat generator and the heat dissipator is very efficient. Consequently heatsink 34 can be relatively smaller than a heatsink in a system in which tight thermal coupling is not assured.

Although the pressure of components 24 against their respective walls 36 will have a tendency to separate heatsinks 34A, 34B, due to the clamping effect of brackets 82 shown in FIGS. 1-3, heatsinks 34A, 34B are unable to separate.

Yet a further advantage of apparatus 20 can be appreciated by considering that the materials out of which components 24 are made may be subject to creep, meaning that the dimensions of components 24 may change under mechanical loading during their useful life. Referring to FIG. 3, as screw 74 is tightened, screw head 76 will elastically compress Belleville spring 80, resulting in the storage of potential energy in that spring. Consequently, if either of the two components 24 shown in FIG. 3 were to shrink due to creep, some amount of potential energy stored in the spring would be released, having a tendency to push screw 74 upward. This would result in an upward force on wedge 70 urging it further into recess 60, which would, in turn, translate to a relatively stable force pushing components 24 against walls 36. In this respect, spring 80 will accommodate the creep as well as thermal expansion/contraction of components 24.

Viewing FIGS. 1-3, it is clear that the number of elements comprising apparatus 20 are relatively few, and are generally easy to assemble. Because components 24 are pressed into direct contact with heatsink 36, the efficiency of the cooling system is maximized. Apparatus 20 is also an efficient system due to the fact that a number of components 24, 26 are cooled by only two heatsink 34.

Although a number of components 24 are cooled by only two heatsink 34, apparatus 20 is able to accommodate the dimensional tolerances by which the numerous components 24 differ by means of the screw adjustment of fastener 54. Additionally, apparatus 20 is able to accommodate the creep of the materials out of which components 24 are made, or their thermal expansion/contraction, due to the interaction of Belleville spring 80 on screw 74 and the yoke 56/wedge 70 combination.

Although the embodiment of the present invention has been discussed in connection with the heat transfer surfaces of the components 24, 26 forming two planes, A and B, another embodiment of the invention could accomodate components with heat transfer surfaces defining more than two planes. For example, if the sizing and spacing of the components mounted on a base so dictated, heatsinks 34A, 34B could be designed with corresponding recesses or indentations which would accomodate the housing of such components. Like the arrangement shown in FIGS. 1-3, the heat transfer surfaces of all components would be thermally coupled with the heatsinks, even though they extend within their matingly designed recess or indentation.

Accordingly, the invention in its broader aspects is not limited to the specific details, representative apparatus, and illustrative examples shown and described herein. Thus, departures may be made from such details without departing from the spirit or scope of the invention.

What is claimed is:

1. An apparatus for dissipating heat from a system, the system having a base on which is mounted first and second heat transfer surfaces, the first heat transfer surface being separated from the second heat transfer surface by a space, said apparatus comprising:
    means for dissipating heat from the first and second heat transfer surfaces, said heat dissipation means having first and second thermally conductive walls, said heat dissipation means being configured such that with said heat dissipation means mounted on the base, said first conductive wall is adjacent to the first heat transfer surface, and said second conductive wall is adjacent to the second heat transfer surface;
    a yoke having first and second tines, said first and second tines being separated by a yoke recess;
    a wedge which is adapted for insertion within said recess;
    means for adjusting the position of said wedge within said recess; and
    said yoke, said wedge, and said adjustment means being configured such that with said wedge inserted in said yoke recess, and said yoke positioned within the space, said adjustment means can adjust the position of said wedge within said recess such that said first and second tines press the first and second heat transfer surfaces into thermal communication with said first and second conductive walls, respectively.

2. An apparatus as in claim 1, wherein said adjustment means comprises a screw, and wherein said wedge has a matingly configured screw hole, such that with said screw disposed in said screw hole the turning of said screw will adjust the position of said wedge within said recess.

3. An apparatus as in claim 2, further comprisign a tension means which is adjacent to said screw such that when said screw is turned so that said wedge is drawn within said recess, said tension means elasticly compresses and such compression applies a force on said screw which tends to draw said wedge within said recess.

4. An apparatus as in claim 1 further comprising a clamping means for clamping said heat dissipation means, said clamping means being configured for mounting on said heat dissipation means so that as the heat transfer surfaces are pressed into thermal communication with said conductive walls said clamping means prevents the relative spacing of said conductive walls from changing.

5. An apparatus as in claim 3, wherein said tension means comprises a Belleville spring.

6. An apparatus as in claim 1, wherein said heat dissipation means comprises a heat sink which has a plurality of fins.

7. An apparatus for dissipating heat from first and second heat generating electronic components which are mounted on a base, each of the components having a planar heat transfer surface, the components being separated from each other by a space, said apparatus comprising: p1 means for dissipating heat from the components, said heat dissipation means having first and second planar, thermally conductive walls, and said heat dissipation means being configured such that with said heat dissipation means mounted on the base, said first conductive wall is adjacent to the heat transfer surface of the first component, and said second conductive wall is adjacent to the heat transfer surface of the second component;
    means for pressing the heat transfer surfaces of the first and second components into thermal communication with said first and second conductive walls, said pressing means having first and second contact surfaces and having an adjustment means for adjusting the spacing of said contact surfaces relative to one another;
    said pressing means being configured such that with said first and second contact surfaces positioned within the space said adjustment means can be adjusted such that said first and second surfaces respectively engage the first and second components pressing the heat transfer surfaces of both components into direct thermal communication with said walls; and
    clamping means for clamping said heat dissipation means, said clamping means being configured for mounting on said heat dissipation means so that as the heat transfer surfaces of the components are pressed into thermal communication with said conductive walls, thereby applying a force on said conductive walls, said clamping means prevents the relative spacing of said conductive walls from changing.

8. An apparatus as in claim 7, wherein said pressing means further comprsies a yoke having first and second tines on which said contact surfaces are respectively situated, said tines being separated by a generally V-shaped recess.

9. An apparatus as in claim 8, wherein said adjustment means comprises a wedge which is matingly configured for insertion within said recess.

10. An apparatus as in claim wherein said adjustment means further comprises a screw, and wherein said wedge has a matingly configured screw hole, such that with said screw disposed in said screw hole the turning of said screw will adjust the position of said wedge within said recess.

11. An apparatus as in claim 10, further comprising a tension means which is adjacent to said screw such that when said screw is turned so that said wedge is drawn within said recess, said tension means elasticly compresses to apply a force on said screw which tends to draw said wedge within said recess.

12. An apparatus as in claim 11, wherein said tension means comprises a Belleville spring.

13. An apparatus as in claim 7, wherein said heat dissipation means comprises a heat sink which has a plurality of fins.

14. An apparatus as in claim 7, wherein said clamping means comprises a C-clamp bracket.

15. An apparatus as in claim 7, wherein said contact surfaces are convex shaped.

16. An apparatus for dissipating heat from first, second and third heat generating electronic components which are mounted on a base, each of the components having a heat transfer surface, the first and second components being separated from each other by a space, said apparatus comprising:
    means for dissipating heat from the components, said heat dissipation means having first and second thermally conductive walls, said heat dissipation means being configured such that with said heat dissipation means mounted on the base, said first conductive wall is adjacent to the heat transfer surface of the first and third component, and said second conductive wall is adjacent to the heat transfer surface of the second component;
    means for pressing the heat transfer surfaces of the first and second components into direct thermal communication with said first and second conductive walls, said pressing means having first and second contact surfaces and having an adjustment means for adjusting the spacing of said contact surfaces relative to one another;
    said pressing means being configured such that with said first and second contact surfaces positioned within the space, said adjustment means can be adjusted such that said first and second contact surfaces respectively engage the first and second components pressing the heat transfer surfaces of both components into thermal communication with said conductive walls; and
    clamping means for clamping said heat dissipation means, said clamping means being configured for mounting on said heat dissipatin means so that as the heat transfer surfaces of the components are pressed into contact with said conductive walls, thereby applying a force on said conductive walls, said clamping means prevents the relative spacing of said conductive walls from changing.

17. An apparatus as in claim 16, wherein said pressing means further comprises a yoke having first and second tines on which said contact surfaces are respectively situated, said tines being separated by a generally V-shaped recess.

18. An apparatus as in claim 17, wherein said adjustment means comprises a wedge which is matingly configured for insertion within said recess.

19. An apparatus as in claim 18, wherein said adjustment means further comprises a screw, and wherein said wedge has a matingly configured screw hole, such that with said screw disposed in said screw hole the turning of said screw will adjust the position of said wedge within said recess.

20. An apparatus as in claim 19, further comprising a tension means which is adjacent to said screw such that when said screw is turned so that said wedge is drawn within said recess, said tension means elasticly compresses to apply a force on said screw which tends to draw said wedge within said recess.

21. An apparatus as in claim 20, wherein said tension means comprises a Belleville spring.

22. An apparatus as in claim 16, wherein said heat dissipation means comprises a heat sink which has a plurality of fins.

23. An apparatus as in claim 16, wherein said clamping means comprises a C-clamp bracket.

24. An apparatus as in claim 16, wherein said contact surfaces are convex shaped.

25. An apparatus as in claim 16, wherein said thermally conductive walls are each planar.

* * * * *